United States Patent [19]

Battey

[11] Patent Number: 4,482,425

[45] Date of Patent: Nov. 13, 1984

[54] LIQUID ETCHING REACTOR AND METHOD

[75] Inventor: James F. Battey, Los Altos, Calif.

[73] Assignee: Psi Star, Inc., Hayward, Calif.

[21] Appl. No.: 508,525

[22] Filed: Jun. 27, 1983

[51] Int. Cl.³ .................. C23F 1/00; B44C 1/22; C03C 15/00; C03C 25/06

[52] U.S. Cl. .................. 156/637; 156/642; 156/656; 156/659.1; 156/666; 156/901; 156/345

[58] Field of Search .................. 156/637–640, 156/641, 642, 650, 651, 656, 659.1, 661.1, 666, 345, 901, 902; 252/79.2

[56] References Cited

U.S. PATENT DOCUMENTS 3,751,313  8/1973  DiBenedetto et al. ......... 156/656 X
4,376,009  3/1983  Kunz ............................. 156/345 X Primary Examiner—William A. Powell
Attorney, Agent, or Firm—Flehr, Hohbach, Test, Albritton & Herbert

[57] ABSTRACT

Reactor and method for removing a material such as copper from a substrate such as a printed circuit board, utilizing a liquid etchant. The work to be etched is placed in a narrow channel, and the etchant is pumped rapidly across the surface of the work at a rate such that the composition of the etchant does not change significantly from one side of the work to the other.

23 Claims, 4 Drawing Figures

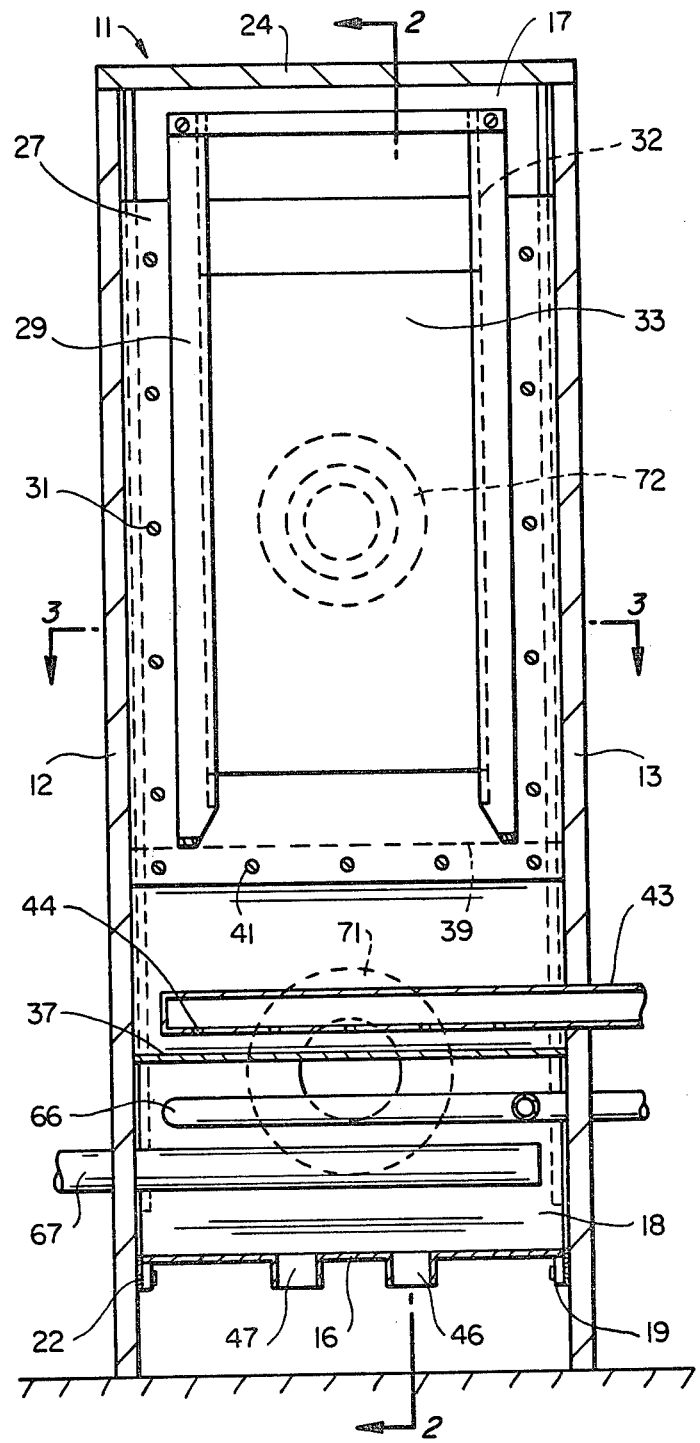
FIG_1

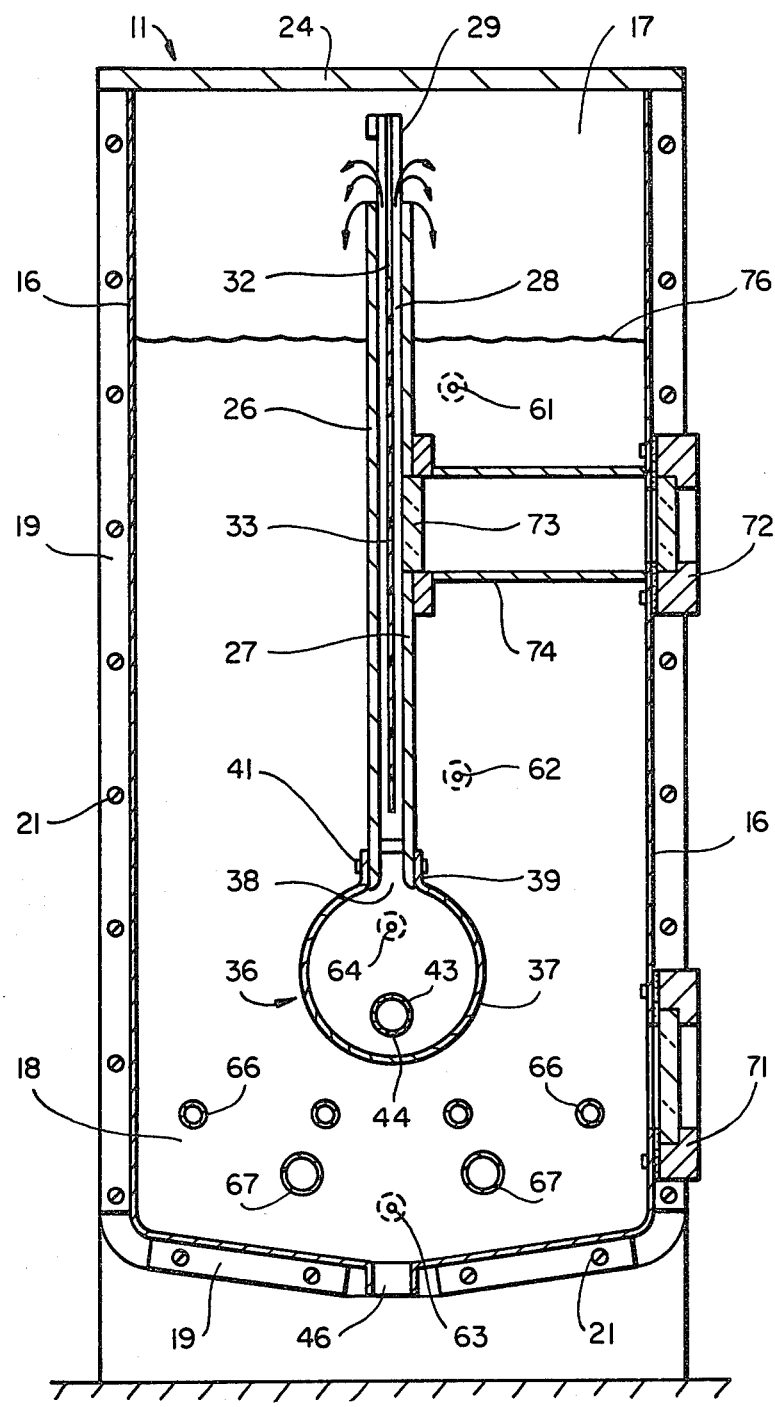
FIG_2

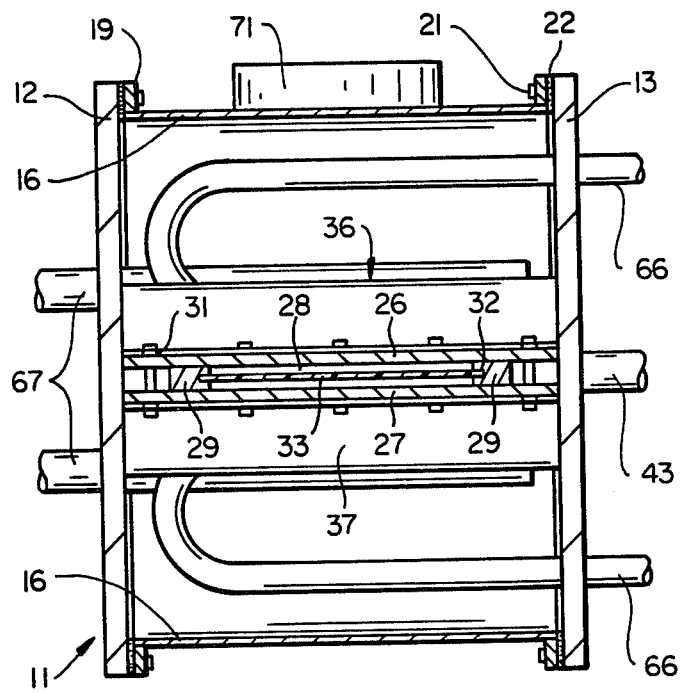
FIG_3
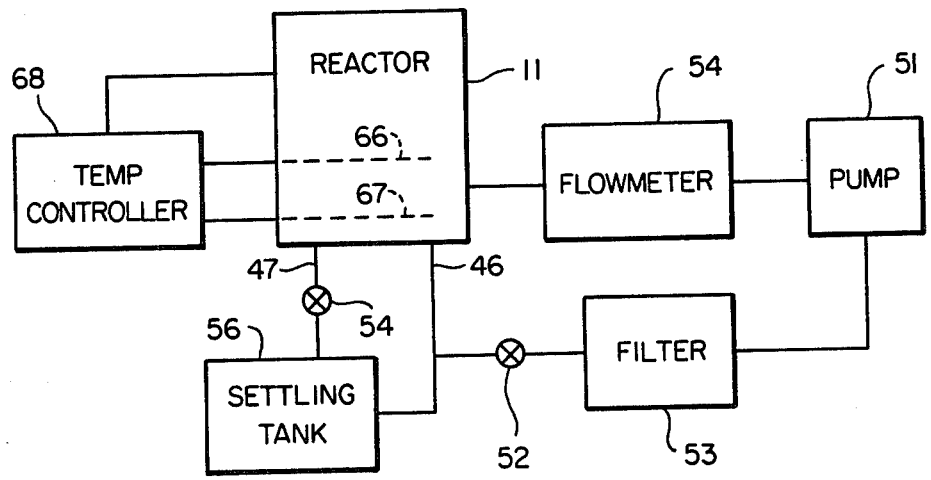
FIG_4

LIQUID ETCHING REACTOR AND METHOD

This invention pertains generally to the removal of material from a substrate, and more particularly to a reactor and method utilizing a liquid etchant for removing a material such as copper from a substrate such as a printed circuit board.

Circuit boards are currently etched by immersion etching, bubble etching, splash or paddle etching, and spray etching. Each of these techniques is subject to certain limitations and disadvantages.

In immersion or deep tank etching, the circuit board is immersed in a liquid etchant until the etching is complete. Process times are long, and this technique is not suitable for use in high volume production. The reaction can be speeded up by heating and mechanical agitation, but these events must take place uniformly over the surface of the board if uniform etching is desired.

Bubble etching is a modified form of immersion etching, in which air is bubbled through the etching solution and past the work to be etched. The bubbling effect removes the etched copper and assists in providing fresh etchant at the surface to be etched. The bubbles also provide a source of oxygen and additional oxidizing power. Uniform etching requires a relatively uniform distribution of the bubbles throughout the surface area of the copper to be removed, and this generally requires an elaborate system for introducing the air into the solution. Cooling of the solution is required in some applications, and it may be necessary to change the position of the board to achieve more uniform etching.

In paddle or splash etching, the etching solution is picked up in a cup attached to a motor driven shaft and thrown at the board being etched. For reasons that are not entirely clear, this method seems to have advantages with respect to uniformity of etching and minimization of undercutting. However, this method has the disadvantage of being relatively slow. Uniformity can be improved by rotating and turning the boards.

Spray etching techniques are used on both single-sided boards and double-sided boards with either horizontal or vertical positioning of the boards. A simple spray etcher has a box-like chamber with a spray nozzle which directs the etchant against the work. More even etching is obtained when a number of nozzles with overlapping spray patterns are used. Further improvement is obtained when the boards are moved during the etching process. Since the etchant runs down a vertically oriented board, etching is more rapid at the bottom of the board than at the top, and it is necessary to rotate the board to overcome this problem. With horizontally oriented boards, nonuniform etching tends to occur because the etching solution remains in contact with the upper surfaces of the boards longer than the lower surfaces.

With all of the known techniques for etching copper on printed circuit boards, uniformity is achieved by movement of the work and/or the etchant, and this generally requires a relatively complex system having a number of moving parts which are subject to wear and deterioration. This problem is particularly severe where the moving parts are in contact with the etching solution.

Also, with all of the existing techniques for etching copper on circuit boards, except immersion etching, air and oxygen are present in the immediate vicinity of the board surface during the etching process. With some etching chemistries, this air results in undesired undercutting of the etched pattern.

It is in general an object of the invention to provide a new and improved reactor and method for removing material from a substrate.

Another object of the invention is to provide a reactor and method of the above character which are particularly suitable for use in removing copper from printed circuit boards.

Another object of the invention is to provide a reactor and method of the above character which utilize a liquid etchant and require no moving parts other than a pump for circulating the etchant.

These and other objects are achieved in accordance with the invention by placing the work to be etched in a narrow channel and circulating a liquid etchant rapidly across the surface of the work to remove the copper or other material.

The rate at which the etchant is circulated is such that the composition of the etchant does not change significantly from one side of the work to the other as the material is removed.

FIG. 1 is a vertical sectional view of one embodiment of a reactor according to the invention.

FIG. 2 is a cross sectional view taken along line 2—2 in FIG. 1.

FIG. 3 is a cross sectional view taken along line 3—3 in FIG. 1.

FIG. 4 is a schematic diagram of an etching system utilizing the reactor of FIGS. 1-3.

As illustrated in the drawings, the reactor 11 comprises a pair of generally rectangular, upstanding side plates 12, 13 which are spaced apart in parallel relation on opposite sides of the reactor and adapted to rest upon a suitable supporting surface. A generally U-shaped wall assembly 16 is mounted between the side plates to define a chamber 17 having a sump 18 in the lower portion thereof. The wall assembly has flanges 19 extending along the side edges thereof, and the flanges are secured to side plates 12, 13 by screws 21. Suitable gaskets 22 are positioned between the wall assembly and the side plates to provide a fluid-tight seal. A removable cover 24 provides access to the chamber at the top of the reactor.

The materials of which the reactor is fabricated are selected in accordance with the reaction to be carried out in the reactor. In one presently preferred embodiment for etching copper, the reactor walls are fabricated of stainless steel, and the gaskets are fabricated of Teflon.

A second pair of generally rectangular, upstanding plates 26, 27 form the walls of a relatively narrow, vertically extending channel 28 within chamber 17. These plates are generally parallel to the front and rear walls of the chamber, and they are separated by a distance somewhat greater than the thickness of the work to be etched. In a presently preferred embodiment for etching printed circuit boards, for example, the separation of the plates is such that the width of the channel is on the order of 3-5 times the thickness of a circuit board. Spacers 29 extend vertically between the plates at the sides of the channel, and the plates and spacers are secured together by screws 31. Vertically extending slots 32 are formed in the inner edges of spacers 29 for receiving the lateral edge portions of a circuit board or other planar work piece 33 and positioning the same within the channel. As illustrated, the work piece is preferably positioned with at least one of its surfaces spaced from and generally parallel to the walls of the channel.

Plates 26, 27 are preferably longer than work piece 33, and channel 28 extends a sufficient distance above and below the work piece to minimize edge effects, i.e., nonuniforities in the etching near the upper and lower edges of the work piece.

A manifold assembly 36 is provided toward the lower end of channel 28 for introducing the liquid etchant into the channel. The manifold comprises a generally cylindrical outer body or tube 37 which extends in a horizontal direction below the channel, with plates 26, 27 extending from the manifolds in a generally radial direction. The interior of the manifold body communicates directly with the lower portion of channel 28 through an opening 38, and the manifold body is secured to channel plates 26, 27 by radial flanges 39 and screws 41.

The manifold assembly also includes a diffuser pipe 43 which is positioned eccentrically within tube 37 and extends in a direction generally parallel to opening 38. The diffuser pipe has a plurality of discharge openings 44 which face in a generally downward direction, away from opening 38.

Two drain ports 46, 47 are provided in the bottom wall of chamber 17. The liquid etchant is delivered from sump 18 to distribution tube 43 by a pump 51 connected to drain 46. As illustrated in FIG. 4, the etchant is supplied to the pump via a control valve 52 and a filter 53, and a flowmeter 54 is connected between the output of the pump and the distribution tube. Drain 47 is connected to a settling tank 56 where copper nitrate is crystalized and removed from the etching solution. The flow of the etching solution to tank 56 is controlled by a vale 57, and the recovered etchant is returned to the reactor through filter 53 and pump 51.

As discussed more fully hereinafter, the flow rate of the etchant through the channel is made relatively fast so that the composition of the etchant does not change significantly between the inlet and discharge ends of the channel as material is removed from the work piece.

The etchant is chosen in accordance with the nature of the work piece and the material to be removed. For removing copper from printed circuit boards, suitable etchants include aqueous solutions of reagents such as nitric acid, nitric oxide and nitrogen dioxide. The chemistry by which copper is etched by these reagents is discussed in detail in copending application Ser. No. 501,159, filed June 6, 1983. With these reagents, copper nitrate is produced by the reaction of the etching solution with the copper, and substantially uniform etching is assured by maintaining the flow rate of the etchant at a level such that the concentration of the copper nitrate increases no more than about ten percent during each pass of the etchant through the channel. The reactor can also be used advantageously with other copper etching chemistries such as the $H_2O_2$—$H_2SO_4$ chemistry heretofore employed in other systems and described in the Printed Circuit Handbork, edited by C.F. Coombs, Jr.

Thermocouples 61–63 and 64 are provided for monitoring the temperature of the etching solution within chamber 18 and manifold 36, and cooling coils 66 and heating elements 67 are provided in sump 18 for maintaining the etchant at the desired temperature. Operation of the cooling coils and heating elements is controlled by a controller 68 in accordance with the signals produced by the thermocouples.

Viewing ports or windows 71, 72 are mounted on the front wall of the reactor to permit visual observation of the etching process. Window 71 is located toward the lower portion of the chamber, and the etchant in sump 18 can be monitored visually through this window. Window 72 is aligned with a window 73 in channel wall 27, and the etching of work piece 33 can be observed through these windows. A tube or bellows 74 extends between windows 72 and 73 to provide a sealed viewing port between the windows from which the etchant is excluded.

Operation and use of the reactor, and therein the method of the invention, can now be described. It is assumed that photoresist has been applied to the copper foil on one or both sides of a printed circuit board to define a desired pattern. The board is inserted into channel 28, and a suitable etchant 76 is introduced into chamber 17. With valve 52 open and valve 57 closed, pump 51 is actuated to circulate the etchant in an upward direction through channel 28 and past the surface or surfaces of the board from which the copper is to be removed. The flow rate of the etchant through the relatively narrow channel is rapid, with little change in the composition of the etchant from one end of the channel to the other. With reagents such as nitric acid, nitric oxide and nitrogen dioxide, a certain amount of copper nitrate is also present in the etching solution, and additional copper nitrate is produced by the reaction of the etchant with the copper. To assure uniform etching across the entire lateral extent of the circuit board, the flow rate of the etchant is set to limit the increase in the concentration of the copper nitrate to no more than about ten percent per pass through the channel. When the desired amount of copper has been removed, the pump is turned off, and the etched board is removed from the reactor.

The etching of copper according to this process is an exothermal reaction, which is preferably carried out at a temperature on the order of 40° C. At the outset of the reaction, the temperature of the etchant is generally below 40° C., and heating elements 67 are actuated to raise the temperature to the desired level. As the reaction progresses and heat is generated, cooling coils 66 are actuated to cool the etchant to the desired temperature.

When the concentration of copper nitrate in the etching solution reaches a predetermined level, valve 52 is closed, and valve 57 is opened to drain the etching solution into settling tank 56. There the solution is cooled or heated to crystalize the copper nitrate. The recovered etchant is returned to the reactor, and the copper nitrate is then removed from the tank.

The invention has a number of important features and advantages. By removing only a small amount of copper or other material during each pass of the etchant through the channel, the composition of the etchant remains relatively unchanged during the pass, and the material is removed uniformly across the entire substrate. The system has no moving parts except for the pump, and it is inexpensive to manufacture and easy to maintain.

While the invention has been described with specific reference to the etching of copper on printed circuit boards, it is also suitable for other applications such as photo engraving, the etching of hybrid circuits, and the removal of other materials from other substrates. A plurality of etching channels can be employed in a single reactor, and the boards or other workpieces to be etched can be moved dynamically through the etching channel or channels.

It is apparent from the foregoing that a new and improved reactor and method have been provided. While only certain presently preferred embodiments have been described in detail, as will be apparent to those familiar with the art, certain changes and modifications can be made without departing from the scope of the invention as defined by the following claims.

I claim:

1. In a reactor for removing material by etching from a substrate: means defining a relatively narrow channel of slightly greater dimension than the substrate, means for positioning the substrate in the channel, and means for passing a liquid etchant through the channel at a flow rate such that the composition of the etchant does not change significantly from one end of the substrate to the other as the material is removed from the substrate.

2. In a reactor for removing copper by etching from a substrate: means defining a relatively narrow channel of slightly greater dimension than the substrate, means for positioning the substrate in the channel, and means for passing a liquid etchant comprising an aqueous solution of a reagent selected from the group consisting of nitric acid, nitric oxide and nitrogen dioxide through the channel at a flow rate such that the composition of the etchant does not change significantly from one end of the substrate to the other as the copper is removed from the substrate.

3. The reactor of claim 2 wherein copper nitrate is produced by the reaction of the etchant with the copper, and the flow rate is selected to produce an increase of no more than about ten percent in the concentration of the copper nitrate from one side of the substrate to the other.

4. In a reactor for removing copper by etching from a printed circuit board: means defining a relatively narrow channel of slightly greater dimension than the circuit board, means for positioning the circuit board in the channel, and means for passing a liquid through the channel at a flow rate such that the composition of the etchant does not change significantly from one end of the circuit board to the other as the copper is removed from the circuit board.

5. In a method for removing material by etching from a substrate, the steps of placing the substrate in a relatively narrow channel of slightly greater dimension than the substrate, and passing a liquid etchant through the channel at a flow rate such that the composition of the etchant does not change significantly from one end of the substrate to the other as the material is removed from the substrate.

6. In a method for removing copper by etching from a substrate, the steps of placing the substrate in a relatively narrow channel of slightly greater dimension than the substrate, and passing a liquid etchant comprising an aqueous solution of a reagent selected from the group consisting of nitric acid, nitric oxide and nitrogen dioxide through the channel at a flow rate such that the composition of the etchant does not change significantly from one end of the substrate to the other as the copper is removed from the substrate.

7. The method of claim 6 wherein copper nitrate is produced by the reaction of the etchant with the copper, and the flow rate is selected to produce an increase of no more than about ten percent in the concentration of the copper nitrate from one side of the substrate to the other.

8. In a method for removing copper by etching from a printed circuit board, the steps of placing the circuit board in a relatively narrow channel of slightly greater dimension than the circuit board, and passing a liquid etchant through the channel at a flow rate such that the composition of the etchant does not change significantly from one end of the circuit board to the other as the copper is removed from the circuit board.

9. In a reactor for etching a material on a generally planar substrate: a pair of generally parallel planar walls spaced apart by a distance somewhat greater than the thickness of the substrate to define a relatively narrow channel, means for positioning the substrate in the channel with at least one surface of the substrate being spaced away from the walls of the channel, means for circulating a liquid etchant through the channel to remove the material from the substrate, and a sump in fluid communication with the channel for collecting the etchant which has passed through the channel.

10. The reactor of claim 9 wherein the substrate is a printed circuit board, the material to be removed is copper, and the etchant comprises an aqueous solution of a reagent selected from the group consisting of nitric acid, nitric oxide and nitrogen dioxide.

11. The reactor of claim 10 wherein copper nitrate is produced by the reaction of the etchant with the copper, and the etchant is circulated at a rate such that the concentration of copper nitrate increases by no more than about ten percent for each pass of the etchant through the channel.

12. The reactor of claim 11 including means communicating with the sump for removing the copper nitrate from the solution.

13. The reactor of claim 9 wherein the means for circulating the etchant comprises a manifold having a generally cylindrical body connected to one end of the channel with the walls of the channel extending in a generally radial direction from the manifold, and a pump for circulating the etchant from the sump through the manifold.

14. The reactor of claim 13 wherein the means for circulating the etchant further includes a dispersion tube within the manifold body having a plurality of discharge openings which face away from the channel.

15. The reactor of claim 13 wherein the channel extends in a generally vertical direction and the manifold and the sump are positioned toward the lower end of the channel.

16. The reactor of claim 9 including means for monitoring the temperature of the etchant, and means for maintaining the etchant at a predetermined temperature.

17. The reactor of claim 16 wherein the means for maintaining the etchant at the predetermined temperature includes heating and cooling elements in the sump.

18. In a reactor for removing copper from a printed circuit board with a liquid etchant: a chamber for holding the etchant having a sump in the lower portion thereof, a pair of generally parallel upstanding walls spaced apart by a distance somewhat greater than the thickness of the printed circuit board defining a vertically extending channel within the chamber, means for positioning the printed circuit board within the channel with at least one surface of the board being spaced from and parallel to the walls of the channel, a horizontally extending manifold communicating with the channel at the lower end thereof, and means including a pump interconnecting the sump and the manifold for circulating the liquid etchant in an upward direction through the channel to remove the copper from the circuit board.

19. The reactor of claim 18 wherein the etchant comprises an aqueous solution of a reagent selected from a group consisting of nitric acid, nitric oxide and nitrogen dioxide.

20. The reactor of claim 19 wherein copper nitrate is produced by the reaction of the etchant with the copper, and the etchant is circulated at a rate such that the concentration of the copper nitrate increases no more than about ten percent for each pass of the etchant through the channel.

21. The reactor of claim 18 wherein the manifold includes a generally cylindrical body from which the channel walls extend in a generally radial direction, and a dispersion tube within the manifold by having discharge openings which face away from the channel.

22. The reactor of claim 18 including means for monitoring the temperature of the etchant, and means for maintaining the etchant at a predetermined temperature.

23. The reactor of claim 22 wherein the means for maintaining the etchant at a predetermined temperature includes heating and cooling elements in the sump.

* * * * *